United States Patent [19]
Li et al.

[11] Patent Number: 5,888,887
[45] Date of Patent: Mar. 30, 1999

[54] TRENCHLESS BURIED CONTACT PROCESS TECHNOLOGY

[75] Inventors: Xudong Li; Xuechun Dai; Guangping Hua; Kei Tee Tiew, all of Singapore, Singapore

[73] Assignee: Chartered Semiconductor Manufacturing, Ltd., Singapore, Singapore

[21] Appl. No.: 990,697

[22] Filed: Dec. 15, 1997

[51] Int. Cl.[6] .................................................. H01L 21/28
[52] U.S. Cl. ........................ 438/525; 438/533; 438/597; 438/640; 438/647; 438/657
[58] Field of Search ................................. 438/597, 647, 438/657, 684, 525, 531, 533, 638, 640, 701; 257/382, 383, 384, 385, 755, 756

[56] References Cited

U.S. PATENT DOCUMENTS

| | | | |
|---|---|---|---|
| 5,376,577 | 12/1994 | Roberts et al. | 438/526 |
| 5,378,641 | 1/1995 | Cheffings | 438/302 |
| 5,494,848 | 2/1996 | Chin | 438/238 |
| 5,563,098 | 10/1996 | Kuo et al. | 438/526 |
| 5,581,093 | 12/1996 | Sakamoto | 257/67 |
| 5,589,418 | 12/1996 | Kalnitsky et al. | 438/384 |
| 5,593,922 | 1/1997 | Liaw et al. | 438/302 |
| 5,596,215 | 1/1997 | Huang | 257/344 |
| 5,607,881 | 3/1997 | Huang | 438/238 |
| 5,668,051 | 9/1997 | Chen et al. | 438/558 |
| 5,705,437 | 1/1998 | Wu et al | 438/238 |
| 5,721,146 | 2/1998 | Liaw et al. | 438/302 |
| 5,742,088 | 4/1998 | Pan et al. | 257/382 |

OTHER PUBLICATIONS

Abercombie, D., et al., "Managing Implant Shadowing." Semiconductor International, Sep. 1996, pp. 107–109.

Primary Examiner—T. N. Quach
Attorney, Agent, or Firm—George O. Saile; Stephen B. Ackerman; Rosemary L. S. Pike

[57] ABSTRACT

A method of forming a buried contact junction without forming a buried contact trench and without a disconnection gap in the current path by using a tapered polysilicon profile and a large angle tilt buried contact implant is described. A layer of gate silicon oxide is provided over the surface of a semiconductor substrate. A first polysilicon layer is deposited overlying the gate silicon oxide layer. The first polysilicon layer is etched away where it is not covered by a buried contact mask to provide an opening to the semiconductor substrate wherein the first polysilicon layer is tapered such that the bottom of the opening has a width the size of the planned buried contact and wherein the top of the opening has a width larger than the size of the planned buried contact. Ions are implanted at a tilt angle into the substrate within the opening whereby the ions penetrate the substrate laterally underlying with said first polysilicon layer to form the buried contact. A second layer of polysilicon is deposited over the first polysilicon layer and over the semiconductor substrate within the opening and patterned to form a polysilicon contact overlying the buried contact junction to complete formation of a buried contact in the fabrication of an integrated circuit.

32 Claims, 5 Drawing Sheets

TRENCHLESS BURIED CONTACT PROCESS TECHNOLOGY

BACKGROUND OF THE INVENTION (1) Field of the Invention

The invention relates to the fabrication of integrated circuit devices, and more particularly, to a method of eliminating a buried contact trench in the fabrication of integrated circuits.

(2) Description of the Prior Art

A buried contact is widely used in modern static random access memory (SRAM) processes to connect a polysilicon line to an active area. Referring to FIGS. 1–4, a typical buried contact process of the prior art will be described. FIG. 1 illustrates a partially completed integrated circuit device having a semiconductor substrate 10. An isolation region, such as Field OXide region 12 is formed as is conventional in the art. A layer of gate oxide 14 is grown or deposited over the surface of the substrate. A relatively thin layer of polysilicon 16 is deposited over the gate oxide layer 14. A photoresist mask 20 is used to pattern the polysilicon to form an opening over the planned buried contact. With the gate oxide as a protective layer, a vertical implant angle plug ion implantation 22 is performed to form the buried contact region 24. Usually, a quadrant angle tilt isolation implantation is performed to form a deeper isolation region 26 to isolation the plug implant from the surrounding region. Referring now to FIG. 2, the gate oxide layer 14 in the buried contact area is removed, then a second layer of polysilicon 28 is deposited which contacts the substrate through the buried contact opening. Next, the polysilicon is patterned. During the thermal cycle of the fabrication process, the plug implantation will diffuse laterally, about 0.05 microns, A. After lateral diffusion, the buried contact region will have a diffusion profile as illustrated by 25.

FIGS. 3 and 4 illustrate two potential problems affecting the function of the buried contact. Referring now to FIG. 3, there is illustrated a buried contact trench 32. The overlap of polysilicon 28 to the buried contact region 24 normally is less than about 0.05 microns. The misalignment, or overlay, of the stepper used in photolithography usually is less than 0.10 microns, depending upon the machine specification. If the misalignment causes the polysilicon pattern not to fully cover the buried contact opening, as shown in FIG. 3 (that is, the photomask 30 is shifted to the left), the substrate will be etched into during the polysilicon etch resulting in the buried contact trench 32. This is because the etch selectivity of polysilicon to the substrate silicon is very low. The trench causes a poor connection and increased junction leakage. If the trench is deep enough, it will break through the junction.

FIG. 4 illustrates a second potential misalignment problem. If the misalignment of the photoresist mask 30 causes the polysilicon to overlap the buried contact by too much (that is, the photomask 30 is shifted to the right), a disconnection gap 34 may occur. After etching of the polysilicon 28, a source/drain implantation is performed to form source/drain region 27. The source/drain region 27 should contact the buried contact region 25. However, because of misalignment, even with lateral diffusion of the source/drain region 27, there is a gap 34 between the source/drain region 27 and the buried contact region 35. Disconnection results in device failure. Therefore, this error is to be avoided at all costs. Workers in the art would rather have a small trench than to have a disconnection gap. Thus, the overlap of polysilicon to buried contact on the mask is usually set to be 0 to 0.05 microns. Since the layer to layer misalignment of a stepper is around 0.10 microns, this means that a buried contact trench will always be formed. The existence of the trench dramatically reduces the process margin of the polysilicon etch, thus reducing chip yield.

Various inventions have been made to prevent the formation of a buried contact trench, to fill a buried contact trench so that a current path is maintained, or to bridge a disconnection gap. For example, U.S. Pat. No. 5,494,848 to H. W. Chin teaches a method using an oversized mask to protect the buried junction area during overetch so that a misalignment of the mask will not cause the formation of a buried contact trench. U.S. Pat. No. 5,596,215 to Huang teaches forming spacers on the sidewalls of the gate structures to fill the buried contact trench and form a current path. U.S. Pat. No. 5,607,881 to Huang teaches linking the buried contact junction and the source junction by an extra high dose N+ implant to overcome the disadvantages of a buried contact trench. U.S. Pat. No. 5,378,641 to Cheffings teaches a two-step angled implant to form the buried contact and a substrate interconnect between the buried contact and the source/drain region. U.S. Pat. No. 5,581,093 to Sakamoto teaches another method of forming a buried contact.

Large tilt angle ion implantation and tapered polysilicon gates have been used in the art. For example, U.S. Pat. No. 5,593,922 to Liaw et al teaches a channel stop implant using large angle tilt in order to isolate closely spaced buried contact junctions. In the paper, "Managing Implant Shadowing," by D. Abercrombie et al, *Semiconductor International*, September 1996, pp. 107–109, the authors show that a 7 degree tilt angle source/drain implant around a tapered polysilicon gate produces symmetrical source/drain implants while a vertical polysilicon gate results in shadowing; non-symmetrical source/drain implants.

SUMMARY OF THE INVENTION

Accordingly, it is a principal object of the present invention to provide an effective and very manufacturable method of forming buried contact junctions.

Another object of the present invention is to provide a method of forming buried contact junctions without forming a buried contact trench.

Yet another object of the present invention is to provide a method of forming buried contact junctions without a disconnection gap in the current path.

Yet another object of the present invention is to provide a method of forming buried contact junctions without forming a buried contact trench by using a large angle tilt buried contact implant.

A further object of the invention is to provide a method of forming buried contact junctions without forming a buried contact trench by using a tapered polysilicon profile.

A still further object of the invention is to provide a method of forming buried contact junctions without forming a buried contact trench by using a tapered polysilicon profile and a large angle tilt buried contact implant.

A still further object of the invention is to provide a method of forming buried contact junctions without forming a buried contact trench and without a disconnection gap in the current path by using a tapered polysilicon profile and a large angle tilt buried contact implant.

In accordance with the objects of this invention a new method of forming a buried contact junction without forming a buried contact trench and without a disconnection gap in the current path by using a tapered polysilicon profile and a large angle tilt buried contact implant is achieved. A layer of gate silicon oxide is provided over the surface of a semiconductor substrate. A first polysilicon layer is deposited overlying the gate silicon oxide layer. The first polysilicon layer is etched away where it is not covered by a buried contact mask to provide an opening to the semiconductor substrate wherein the first polysilicon layer is tapered such that the bottom of the opening has a width the size of the planned buried contact and wherein the top of the opening has a width larger than the size of the planned buried contact. Ions are implanted at a tilt angle into the substrate within the opening whereby the ions penetrate the substrate laterally underlying the first polysilicon layer to form the buried contact. A second layer of polysilicon is deposited over the first polysilicon layer and over the semiconductor substrate within the opening and patterned to form a polysilicon contact overlying the buried contact junction to complete formation of a buried contact in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 5:
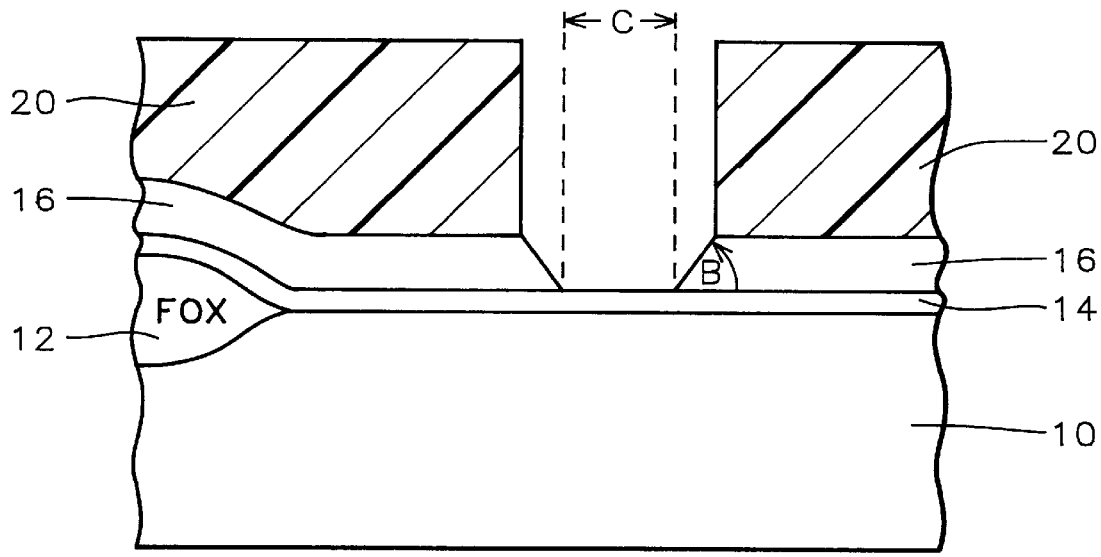
FIGS. 5 through 8 schematically illustrate in cross-sectional representation a preferred embodiment of the present invention.

Referring to FIGS. 5 through 9, a preferred embodiment of the present invention will be described. Referring now more particularly to FIG. 5, there is shown a portion of a partially completed integrated circuit. There is shown a monocrystalline semiconductor substrate 10 in which there are formed field oxide regions 12. A gate oxide layer 14 is grown on the surface of the semiconductor substrate, typically to a thickness of between about 70 to 100 Angstroms. The polysilicon layer 16 is blanket deposited such as by low pressure chemical vapor deposition (LPCVD) to a thickness of about 550 Angstroms. A single polysilicon layer is an acceptable alternative, but the "split poly" process is preferred and will be described here.

A photoresist mask 20 is formed overlying the polysilicon layer 16. A tapered polysilicon profile etch is used. This type of etching normally is implemented by using a relatively higher concentration of chemically reactive radicals to ions in the plasma etch. For example, $SF_6$ gas is flowed at 100 sccm and HBr is flowed at 10 sccm at a pressure of 300 mTorr and power of 300 watts to form the tapered profile of polysilicon layer 16 having an angle B of between about 45 and 70 degrees, as shown in FIG. 5. The opening at the bottom of the tapered profile has a width C which is the desired size of the buried contact opening. The key parameters of this tapered profile etch are a lower concentration of a polymer-forming gas, such as HBr or $CF_4$, and low energy. The reduction of the polymer-forming gas causes less polymer to formed along the sidewall and hence, more of an undercut. Increasing the chemical reactive radical concentration reduces the bombardment effect and results in a more isotropic etch.

Figure 6:
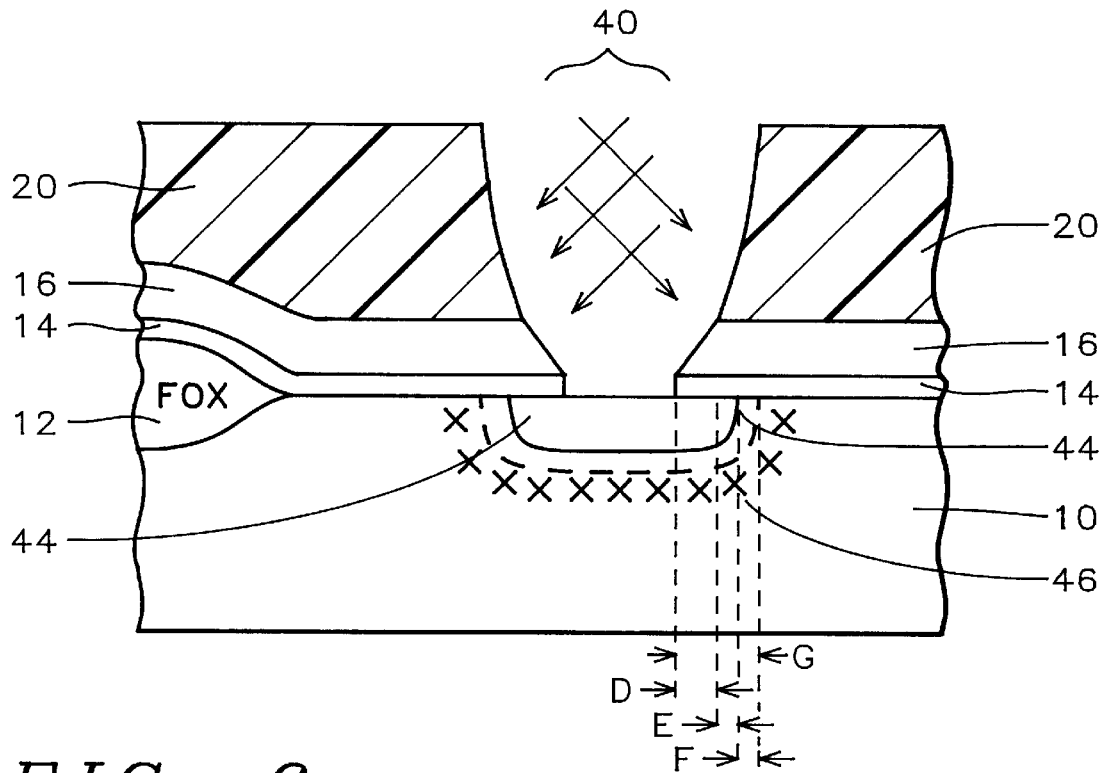

Referring now to FIG. 6, the process of the present invention uses a large angle tilt (LAT) buried contact plug implantation 40. For example, phosphorus ions are implanted with a dosage of between about 1 E 15 to 2 E 15 atoms/$cm^2$ at an energy of 40 to 60 KeV and a tilt angle of between about 15 and 30 degrees to form buried contact 42. This large angle tilt implantation will penetrate under the sidewall of the tapered polysilicon 16 at the bottom of the buried contact opening because of the smaller thickness of the polysilicon and because of the tilt angle.

The diffusion area of the buried contact 42 is increased by the penetration of the ion implantation under the sidewall of the tapered polysilicon by the amount D, which is approximately 0.06 microns. The diffusion area of the buried contact 42 is increased by the LAT implant by the amount E, which is about 0.06 microns. After drive-in and lateral diffusion F of about 0.05–0.07 microns, depending on dosage, the buried contact region will have a diffusion profile as illustrated by 44. Because of the tapered polysilicon profile and the LAT implantation, the diffusion from the edge of the buried contact opening, G=(D+E+F), will be about 0.15 to 0.20 microns.

A large tilt angle boron isolation implantation is then performed to form isolation region 46.

Figure 7:
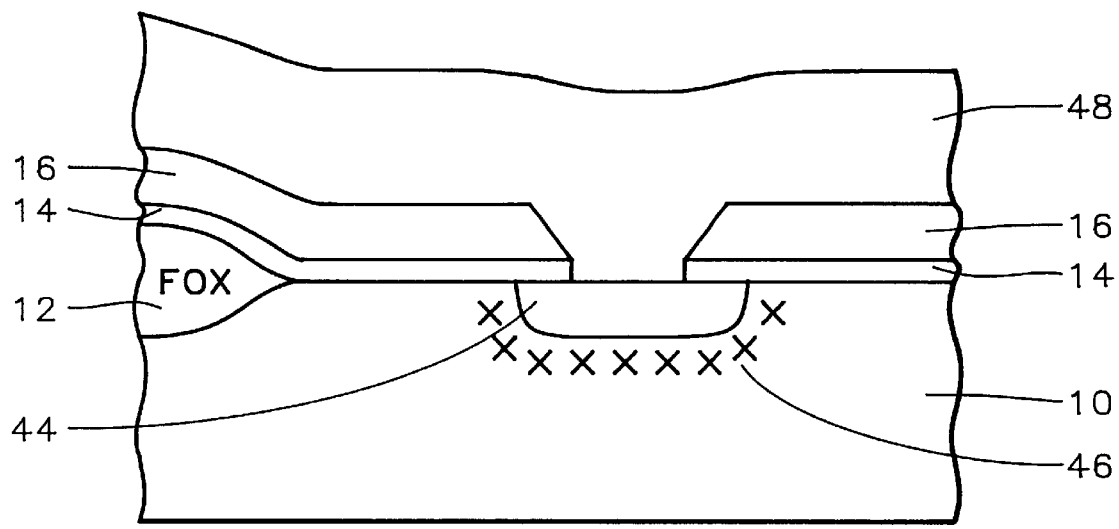

Referring now to FIG. 7, a second layer of polysilicon 48 is deposited by LPCVD to a thickness of between about 1000 to 1200 Angstroms.

A polycide layer 50 may be deposited over the polysilicon layer 48, typically by chemical vapor deposition. This layer may be tungsten silicide, titanium silicide, or the like with a polysilicon capping layer having a combined thickness of between about 1500 to 2000 Angstroms.

Figure 8:
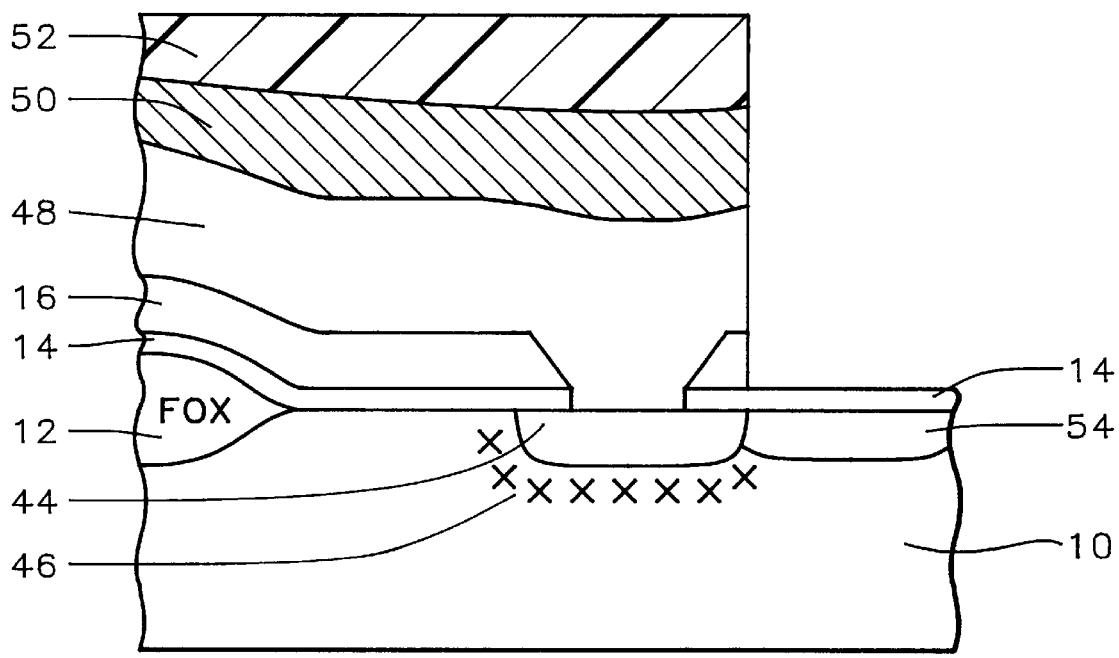

The main polysilicon etch, the results of which are illustrated in FIG. 8, is typically a dry etch with an etch stop at the gate silicon oxide layer 14. Then, the source/drain implantation is performed as is conventional to form source/drain region 54 which contacts the buried contact junction 44. There is also lateral diffusion of the source/drain region 54 of 0.05 to 0.07 microns.

Figure 1:
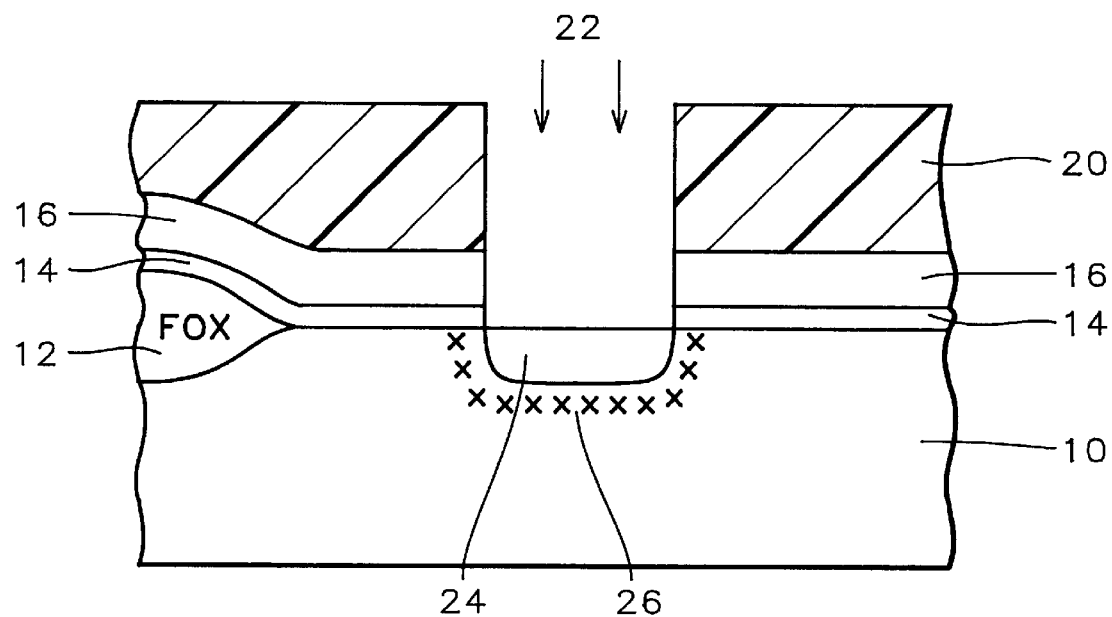
FIGS. 1 through 4 schematically illustrate in cross-sectional representation an embodiment of the prior art.
Figure 2:
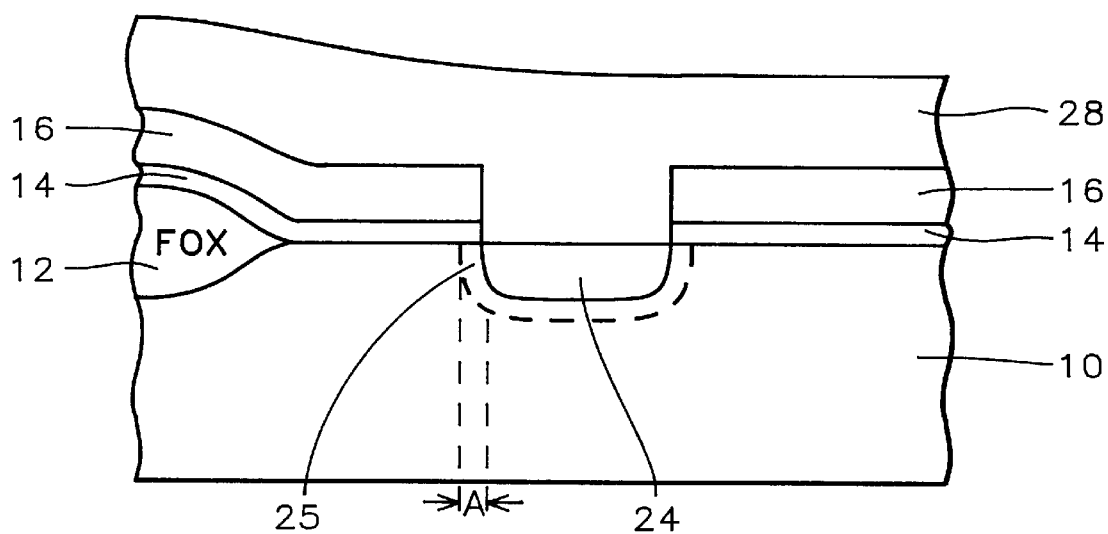
Figure 3:
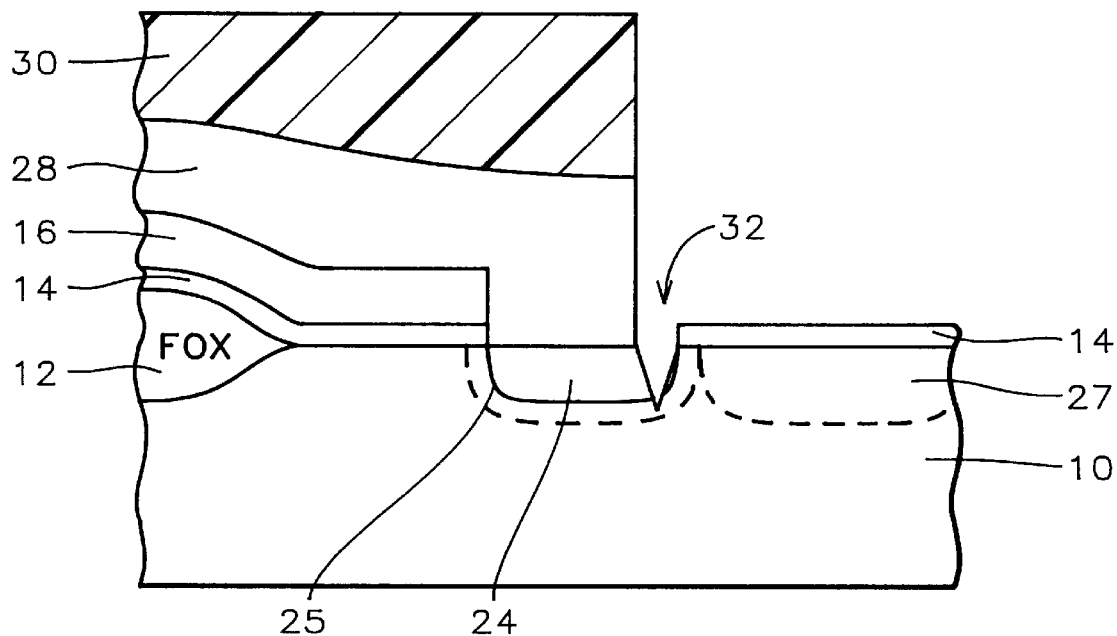
Figure 4:
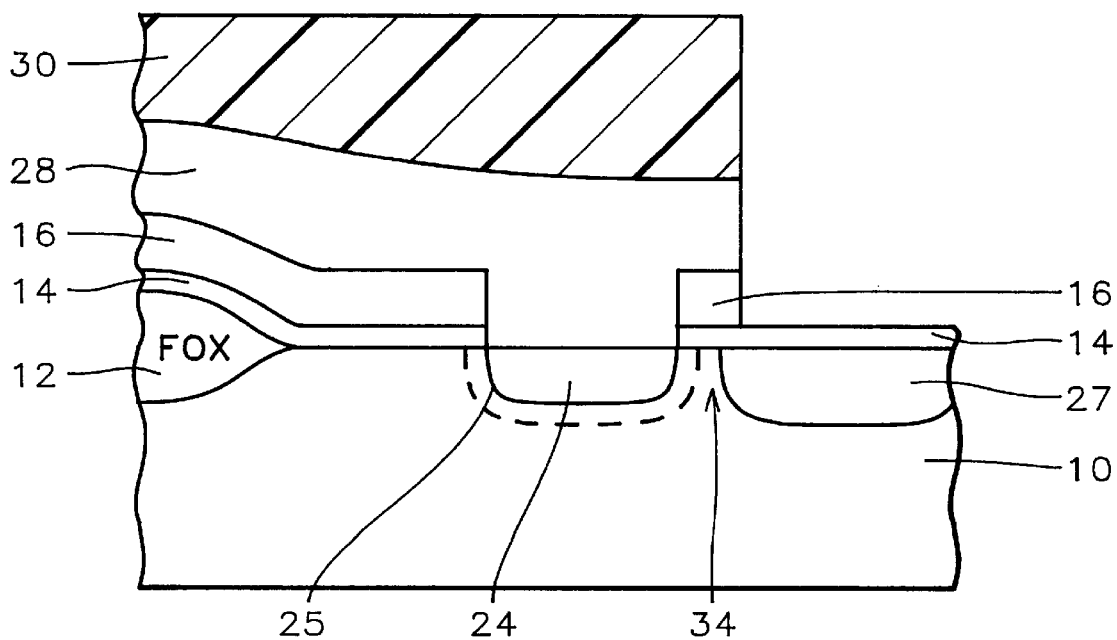

Now, the overlap of the polysilicon to the buried contact (the bottom opening size) on the mask can be designed to be around 0.10 to 0.15 microns. Since the diffusion area under the gate oxide, G, is 0.15 to 0.20 microns, misalignment of the photomask 52 will not result in either a buried contact trench or in a disconnection gap as in the prior art (FIGS. 3 and 4). That is, a misalignment to the left of 0.10 microns is covered by the polysilicon because of the 0.10 to 0.15 overlap, so no trench is formed. A misalignment to the right of 0.10 microns will result in an actual overlap on the wafer of 0.20 to 0.25 microns. However, the diffusion area under the gate oxide is G plus the diffusion of the source/drain region 54; that is, 0.20 to 0.27 microns, so no disconnection gap is found.

The tapered polysilicon profile and large angle tilt buried contact implant result in enough doping under the edge of the buried contact opening that no buried contact trench is formed and no disconnection gap is left between the buried contact junction and the source/drain region. The exact tapered angle of the polysilicon layer 16 and the LAT angle can be determined by the process designer by experimentation.

Figure 9:
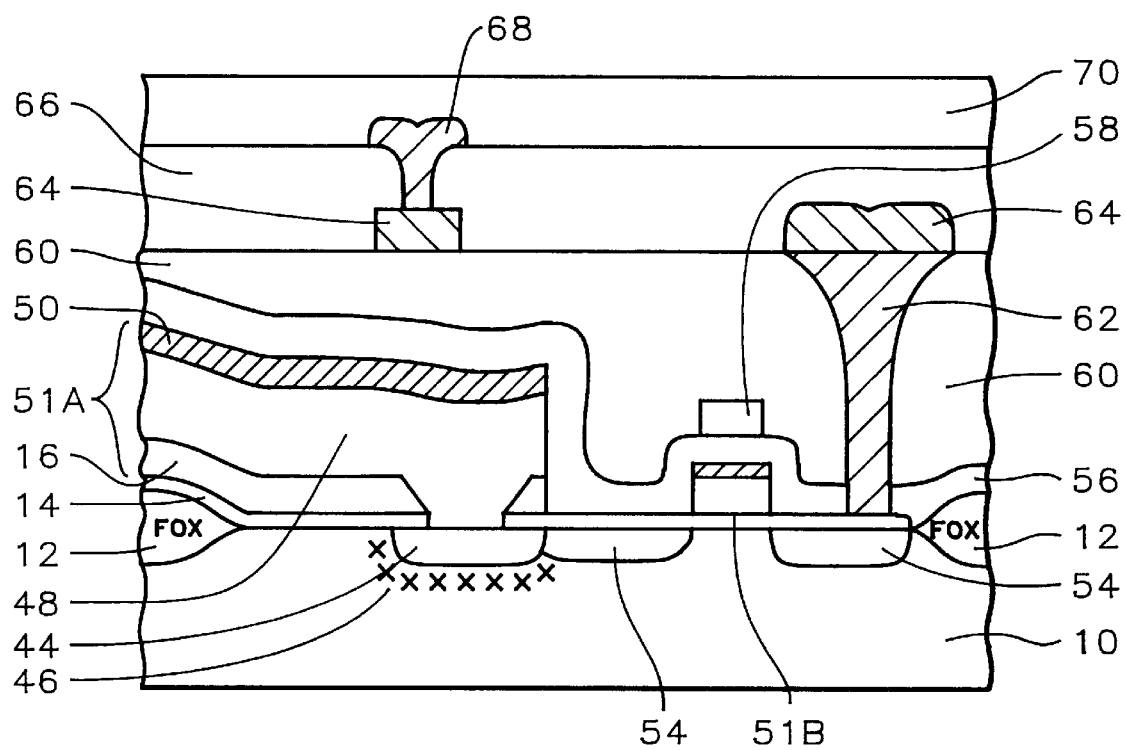
FIG. 9 schematically illustrates in cross-sectional representation a completed SRAM integrated circuit device fabricated according to the process of the present invention.

Processing continues as is conventional in the art to complete the integrated circuit device. This approach can be directly applied to static random access memory (SRAM) buried contacts or to any device utilizing a buried contact for connecting polysilicon and the semiconductor substrate. A SRAM is illustrated in FIG. 9. Elongated polycide contact 51A and gate 51B are shown. Buried contact 44 and source and drain regions 54, which may be N+, are shown within the semiconductor substrate. The first polycide contact 51A and gate 51B have been covered with an interpoly oxide 56 and a second polysilicon layer 58 has been patterned and covered by an interlevel dielectric 60. A contact opening has been made to source/drain region 54 and filled with, for example, a tungsten plug 62 and aluminum metallurgy 64. Intermetal dielectric layer 66 and second level metallurgy 68 are covered by passivation layer 70 to complete the fabrication of the integrated circuit.

The process of the invention provides for the formation of buried contact junctions without forming a buried contact trench by using a tapered polysilicon profile and a large angle tilt buried contact implant. The process of the invention also provides for a complete current path from a polysilicon region through a buried contact region to a source/drain region without a disconnection gap regardless of mask misalignment. The tapered polysilicon profile and large tilt angle implantation result in a larger diffusion under the protective gate oxide layer, hence permitting a larger overlap of polysilicon to buried contact to be designed on the mask; thereby eliminating both a buried contact trench and a disconnection gap.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon layer where it is not covered by a buried contact mask to provide an opening to said semiconductor substrate wherein said first polysilicon layer is tapered such that the bottom of said opening has a width the size of said planned buried contact and wherein the top of said opening has a width larger than the size of said planned buried contact;

implanting ions at a tilt angle into said substrate within said opening whereby said ions penetrate said substrate laterally underlying said first polysilicon layer to form said buried contact;

depositing a second layer of polysilicon over said first polysilicon layer and over said semiconductor substrate within said opening; and patterning said second polysilicon layer to form a polysilicon contact overlying said buried contact junction to complete said formation of said buried contact in the fabrication of an integrated circuit.

2. A method according to claim 1 wherein said first polysilicon layer has a thickness of about 550 Angstroms.

3. A method according to claim 1 wherein said first polysilicon layer after said step of etching away has an angle at said opening of between about 45 to 70 degrees.

4. A method according to claim 1 wherein said implanting ions into said substrate comprises implanting phosphorus ions with a dosage of between about $1 \times 10^{15}$ to $2 \times 10^{15}$ atoms/cm$^2$ and energy of between about 40 and 60 KeV at a tilt angle of between about 15 and 30 degrees.

5. A method according to claim 1 wherein said second polysilicon layer has a thickness of about 1000 Angstroms.

6. A method according to claim 1 further comprising implanting ions to form an isolation implant underlying said buried contact isolation.

7. A method according to claim 1 further comprising depositing a polycide layer overlying said second polysilicon layer before said step of etching said second polysilicon layer.

8. A method according to claim 6 wherein said polycide layer comprises a first layer of tungsten silicide having a thickness of between about 1000 and 2000 Angstroms and a second layer of polysilicon having a thickness of about 550 Angstroms.

9. A method according to claim 1 further comprising implanting ions into said substrate to form source and drain regions after said step of patterning said second polysilicon layer wherein one of said source and drain regions contacts said buried contact region.

10. A method according to claim 1 wherein said step of patterning said second polysilicon layer uses a mask having an overlap of polysilicon to buried contact opening of between about 0.10 to 0.15 microns.

11. A method according to claim 1 wherein said tapered polysilicon layer and said tilt angle combine to form said buried contact having a width larger than said opening.

12. A method according to claim 10 wherein no buried contact trench or disconnection gap is formed in said substrate due to misalignment of said mask.

13. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon layer where it is not covered by a buried contact mask to provide an opening to said semiconductor substrate wherein said first polysilicon layer is tapered such that the bottom of said opening has a width the size of said planned buried contact and wherein the top of said opening has a width larger than the size of said planned buried contact;

implanting ions at a tilt angle into said substrate within said opening whereby said ions penetrate said substrate laterally underlying said first polysilicon layer to form said buried contact wherein said tapered polysilicon layer and said tilt angle combine to form said buried contact having a width larger than said opening;

depositing a second layer of polysilicon over said first polysilicon layer and over said semiconductor substrate within said opening; and patterning said second polysilicon layer to form a polysilicon contact overlying said buried contact junction to complete said formation of said buried contact in the fabrication of an integrated circuit.

14. A method according to claim 13 wherein said first polysilicon layer has a thickness of about 550 Angstroms.

15. A method according to claim 13 wherein said first polysilicon layer after said step of etching away has an angle at said opening of between about 45 to 70 degrees.

16. A method according to claim 13 wherein said implanting ions into said substrate comprises implanting phosphorus ions with a dosage of between about $1 \times 10^{15}$ to $2 \times 10^{15}$ atoms/cm$^2$ and energy of between about 40 and 60 KeV at a tilt angle of between about 15 and 30 degrees.

17. A method according to claim 13 wherein said second polysilicon layer has a thickness of about 1000 Angstroms.

18. A method according to claim 13 further comprising implanting ions to form an isolation implant underlying said buried contact junction.

19. A method according to claim 13 further comprising depositing a polycide layer overlying said second polysilicon layer before said step of etching said second polysilicon layer.

20. A method according to claim 19 wherein said polycide layer comprises a first layer of tungsten silicide having a thickness of between about 1500 and 2000 Angstroms and a second layer of polysilicon having a thickness of about 550 Angstroms.

21. A method according to claim 13 further comprising implanting ions into said substrate to form source and drain regions after said step of patterning said second polysilicon layer wherein one of said source and drain regions contacts said buried contact region.

22. A method according to claim 13 wherein said step of patterning said second polysilicon layer uses a mask having an overlap of polysilicon to buried contact opening of between about 0.10 to 0.15 microns.

23. A method according to claim 22 wherein no buried contact trench or disconnection gap is formed in said substrate due to misalignment of said mask.

24. A method of forming a buried contact in a semiconductor substrate while preventing formation of a buried contact trench or disconnection gap in the fabrication of an integrated circuit comprising:

providing a layer of gate silicon oxide over the surface of said semiconductor substrate;

depositing a first polysilicon layer overlying said gate silicon oxide layer;

etching away said first polysilicon layer where it is not covered by a buried contact mask to provide an opening to said semiconductor substrate wherein said first polysilicon layer is tapered such that the bottom of said opening has a width the size of said planned buried contact and wherein the top of said opening has a width larger than the size of said planned buried contact;

implanting ions at a tilt angle into said substrate within said opening whereby said ions penetrate said substrate laterally underlying said first polysilicon layer to form said buried contact wherein said tapered polysilicon layer and said tilt angle combine to form said buried contact having a width larger than said opening by between about 0.15 to 0.20 microns on each side of said opening;

depositing a second layer of polysilicon over said first polysilicon layer and over said semiconductor substrate within said opening; and patterning said second polysilicon layer to form a polysilicon contact overlying said buried contact junction using a photoresist mask having an overlap of polysilicon to buried contact opening of between about 0.10 to 0.15 microns wherein said overlap and said larger width of said buried contact prevent formation of a buried contact trench or disconnection gap in the fabrication of an integrated circuit.

25. A method according to claim 24 wherein said first polysilicon layer after said step of etching away has an angle at said opening of between about 45 to 70 degrees.

26. A method according to claim 24 wherein said tapered polysilicon layer adds to said larger width of said buried contact by about 0.06 microns on each side of said opening.

27. A method according to claim 24 wherein said implanting ions into said substrate comprises implanting phosphorus ions with a dosage of between about $1 \times 10^{15}$ to $2 \times 10^{15}$ atoms/cm$^2$ and energy of between about 40 and 60 KeV at a tilt angle of between about 15 and 30 degrees.

28. A method according to claim 24 wherein said implanting ions at said tilt angle adds to said larger width of said buried contact by about 0.06 microns on each side of said opening.

29. A method according to claim 24 further comprising depositing a polycide layer overlying said second polysilicon layer before said step of etching said second polysilicon layer.

30. A method according to claim 24 further comprising implanting ions into said substrate to form source and drain regions after said step of patterning said second polysilicon layer wherein one of said source and drain regions contacts said buried contact region.

31. A method according to claim 24 wherein said photoresist mask is misaligned to the left by up to 0.10 microns and wherein said buried contact trench is prevented by said overlap of said polysilicon to said buried contact.

32. A method according to claim 24 wherein said photoresist mask is misaligned to the right by up to 0.10 microns and wherein said disconnection gap is prevented by said larger width of said buried contact.

* * * * *